US011724354B2

(12) United States Patent
    Chen (10) Patent No.: US 11,724,354 B2
(45) Date of Patent: Aug. 15, 2023

(54) APPARATUS AND METHOD FOR DETERMINING PARAMETERS OF PROCESS OPERATION

(71) Applicant: Ioneer, LLC., Pleasanton, CA (US)

(72) Inventor: Anthony Chen, Pleasanton, CA (US)

(73) Assignee: Ioneer, LLC, Pleasanton, CA (US)

( * ) Notice: Subject to any disclaimer, the term of this patent is extended or adjusted under 35 U.S.C. 154(b) by 1226 days.

(21) Appl. No.: 16/604,095

(22) PCT Filed: Dec. 5, 2016

(86) PCT No.: PCT/US2016/064987
    § 371 (c)(1),
    (2) Date: Oct. 9, 2019

(87) PCT Pub. No.: WO2017/100132
    PCT Pub. Date: Jun. 15, 2017

(65) Prior Publication Data
    US 2021/0101249 A1    Apr. 8, 2021

Related U.S. Application Data

(60) Provisional application No. 62/366,491, filed on Jul. 25, 2016, provisional application No. 62/265,807, filed on Dec. 10, 2015.

(51) Int. Cl.
    *B24B 37/005*   (2012.01)
    *G05B 19/41*    (2006.01)
    *H01L 21/67*    (2006.01)
    *G05B 19/418*   (2006.01)

(52) U.S. Cl.
    CPC ...... *B24B 37/005* (2013.01); *G05B 19/41875* (2013.01); *H01L 21/67253* (2013.01); *G05B 2219/45031* (2013.01)

(58) Field of Classification Search
    None
    See application file for complete search history.

(56) References Cited

U.S. PATENT DOCUMENTS

| 5,644,245 A * | 7/1997 | Saitoh | G01R 31/2891 |
| | | | 324/750.18 |
| 5,675,471 A * | 10/1997 | Kotecki | H01L 21/6833 |
| | | | 361/234 |
| 7,292,057 B2 * | 11/2007 | Cowan | G01R 31/2865 |
| | | | 324/627 |

(Continued)

OTHER PUBLICATIONS

Salama et al., "On-chip Antenna: Practical Design and Characterization Considerations", 2010, 2010 Intl. Symposium on Antenna Tech. and Applied Electromagnetics. (Year: 2010).*

(Continued)

*Primary Examiner* — Mohammad Ali
*Assistant Examiner* — Kelvin Booker (57) ABSTRACT

Various examples of the present technology disclose a self-contained and programmable Processing Probe Apparatus (PPA) that can measure processing properties of a processing tool. The PPA comprises one or more sensors, an analog-to-digital converter and information (ADCI) processor, an electrical power source (EPS), and a digital signal communication device, all of which are attached to a flexible film. The flexible film can be mounted on a substrate that mimics a semiconductor workpiece.

15 Claims, 9 Drawing Sheets

(56) References Cited

U.S. PATENT DOCUMENTS

| | | | | |
|---|---|---|---|---|
| 7,907,384 B2* | 3/2011 | Brown | ............... | H01L 21/6831 |
| | | | | 361/233 |
| 8,226,769 B2* | 7/2012 | Matyushkin | ...... | H01L 21/67109 |
| | | | | 156/345.52 |
| 8,390,980 B2* | 3/2013 | Sansoni | .............. | H01L 21/6833 |
| | | | | 361/234 |
| 8,405,005 B2* | 3/2013 | Zucker | ................ | H01L 21/6831 |
| | | | | 219/468.1 |
| 8,937,800 B2* | 1/2015 | Lubomirsky | ..... | H01L 21/67103 |
| | | | | 361/234 |
| 8,981,263 B2* | 3/2015 | Sasaki | ............... | H01L 21/67248 |
| | | | | 118/725 |
| 9,196,514 B2* | 11/2015 | Parkhe | ................ | H01L 21/6831 |
| 9,622,375 B2* | 4/2017 | Busche | ............... | H01L 21/6831 |
| 9,954,113 B2* | 4/2018 | Shimomura | ...... | H01L 29/78696 |
| 2001/0025691 A1* | 10/2001 | Kanno | .................. | H01J 37/321 |
| | | | | 257/E21.252 |
| 2002/0026251 A1* | 2/2002 | Johnson | ............ | H01J 37/32137 |
| | | | | 700/121 |
| 2004/0126906 A1* | 7/2004 | Klekotka | .......... | H01L 21/67253 |
| | | | | 438/8 |
| 2004/0127030 A1* | 7/2004 | Klekotka | .......... | H01L 21/67253 |
| | | | | 438/689 |
| 2005/0284570 A1* | 12/2005 | Doran | ............... | H01J 37/32935 |
| | | | | 156/345.24 |
| 2006/0238954 A1* | 10/2006 | Ishikawa | ........... | H01L 21/67103 |
| | | | | 361/234 |
| 2007/0284246 A1* | 12/2007 | Keil | .................. | H01J 37/32935 |
| | | | | 204/298.36 |
| 2008/0174324 A1* | 7/2008 | Yamazawa | ........ | H01J 37/32091 |
| | | | | 324/707 |
| 2009/0201622 A1* | 8/2009 | Brown | ................ | H01L 21/6831 |
| | | | | 361/234 |
| 2012/0088316 A1* | 4/2012 | Lu | ...................... | H01L 21/67265 |
| | | | | 438/5 |
| 2013/0011937 A1* | 1/2013 | Lu | ...................... | H01L 21/67265 |
| | | | | 438/5 |
| 2014/0039661 A1* | 2/2014 | Lu | .................... | G05B 19/41875 |
| | | | | 700/110 |
| 2014/0183530 A1* | 7/2014 | Yamazaki | ........... | H01L 29/7869 |
| | | | | 257/43 |
| 2015/0070814 A1* | 3/2015 | Parkhe | .............. | H01L 21/67115 |
| | | | | 118/712 |
| 2015/0187625 A1* | 7/2015 | Busche | .............. | H05K 7/20218 |
| | | | | 361/234 |

OTHER PUBLICATIONS

Freed et al., "Autonomous On-Wafer Sensors for Process Modeling, Diagnosis, and Control", Apr. 2000, IEEE Transactions on Semiconductor Manufacturing, vol. 14, No. 3, Aug. 2001. (Year: 2000).*

* cited by examiner

APPARATUS AND METHOD FOR DETERMINING PARAMETERS OF PROCESS OPERATION

CROSS-REFERENCE TO RELATED APPLICATION

This application claims priority to U.S. Provisional Application 62/265,807, titled "Apparatus and method for obtaining data from process information" and filed at Dec. 10, 2015, and U.S. Provisional Application 62/366,491, titled "Apparatus and method for measuring thermal properties of an electrostatic chuck" and filed at Jul. 25, 2016, the disclosure of which is incorporated herein by reference in its entirety.

SUMMARY

Technical Field

The disclosure relates generally to semiconductor testing equipment. More specifically, certain embodiments of the technology relate to a method and system for testing process information of semiconductor equipment.

Brief Summary

Various examples of the present technology disclose an apparatus for determining processing parameters of a semiconductor processing tool. As critical dimensions in semiconductor devices shrink, accurately control of processing parameters (e.g., processing temperatures, gas concentrations, ion fluxes) in processing tools (e.g., etch and deposition chambers) becomes more important. Accurate control can be achieved by measuring processing parameters that a semiconductor workpiece actually experienced or is experiencing inside a processing tool.

Also, there is a need to prevent contamination (e.g., device degrading metal contaminants or masking particulate matter) inside a processing tool. In addition, processing tools require increasingly tight processing uniformity for semiconductor workpiece, which prohibit uses of an intrusive monitor to record actual processing conditions experienced by the semiconductor workpieces. Therefore, there is a need for a monitoring device that resembles a semiconductor workpiece and can be transferred into a processing tool in the manner that an actual workpiece is transferred, and to satisfy a strict contamination control protocol. Such monitoring devices can be used to measure processing conditions that are actually experienced by a semiconductor workpiece.

Various examples of the present technology disclose a self-contained and programmable Processing Probe Apparatus (PPA) that can measure processing properties of a processing tool. The PPA comprises one or more sensors, a process (e.g., an analog-to-digital converter and information (ADCI) processor), an electrical power source (EPS), and a digital or optical signal communication device, all of which are attached to a flexible film. The flexible film can be sandwiched by two substrates or mounted on a substrate that mimics a semiconductor workpiece.

Various examples of the present technology disclose a method of measuring processing properties of a processing tool. For example, a method may comprise pre-programming a PPA to perform various measurements, transferring the PPA into the processing tool, allowing the PPA to perform measurements while one or more processing conditions or recipes are run on the tool, converting measured processing information into a digital format, storing converted processing information, transferring the apparatus out of the processing tool, and downloading stored processing information onto a computing device.

In some examples, data measured while the one or more processing conditions or recipes are run on the tool can be wireless or optically transmitted to a receiver outside the processing tool. The measure data can be dynamically analyzed and used to dynamically manage the one or more processing conditions or recipes of the processing tool while the one or more processing conditions or recipes are running on the tool. For example, a method may comprise pre-programming a PPA to perform various measurements, transferring the PPA into the processing tool, allowing the PPA to perform measurements while one or more processing conditions or recipes are run on the tool, converting measured processing information into a digital format, transmitting converted processing information to a computing device located outside the processing tool, and transferring the apparatus out of the processing tool.

BRIEF DESCRIPTION OF THE DRAWINGS

In order to describe the manner in which the above-recited and other advantages and features of the disclosure can be obtained, a more particular description of the principles briefly described above will be rendered by reference to specific examples thereof which are illustrated in the appended drawings. Understanding that these drawings depict only examples of the disclosure and are not therefore to be considered to be limiting of its scope, the principles herein are described and explained with additional specificity and detail through the use of the accompanying drawings in which.

DETAILED DESCRIPTION

The detailed description set forth below is intended as a description of various configurations of the present technology and is not intended to represent the only configurations in which the present technology can be practiced. The appended drawings are incorporated herein and constitute a part of the detailed description. The detailed description includes specific details for the purpose of providing a more thorough understanding of the present technology. However, it will be clear and apparent that the present technology is not limited to the specific details set forth herein and may be practiced without these details. In some instances, structures and components are shown in block diagram form in order to avoid obscuring the concepts of the present technology.

Figure 1:
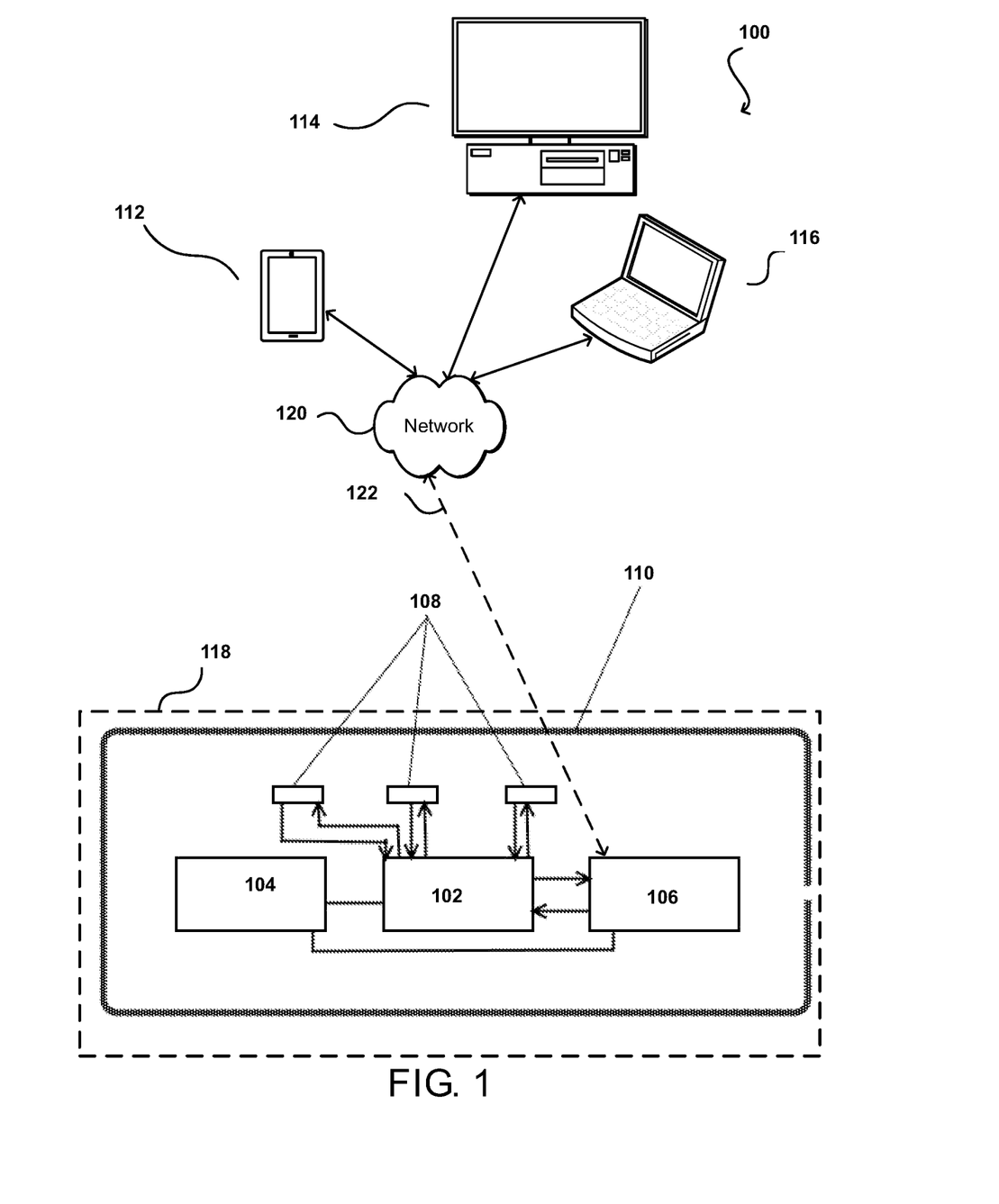
FIG. 1 illustrates an example of a Processing Probe Apparatus (PPA) system according to some aspects of the present technology.

FIG. 1 illustrates an example of a Processing Probe Apparatus (PPA) system 100 according to some aspects of the present technology. In this example, the PPA system comprises a PPA, a receiver (optional), and a computing device (e.g., 112, 114 and 116). The receiver can be a digital or optical receiver. The receiver can be a part of the computing device or coupled to the computing device via a network 120. The PPA can be loaded into a processing tool 118. The computing device is configured to receive data from the receiver or directly from the PPA over the network 120 and analyze received data. The receiver is located outside the processing tool.

In some examples, the receiver can receive data from the PPA via a wireless or optical channel 122, or a wired connection. The wireless or optical channel 122 can be any appropriate channel used to enable the PPA to communicate wirelessly, such as optical, Bluetooth, cellular, NFC, or Wi-Fi channels. The receiver can then transmit received data to the computing device (e.g., 112, 114 and 116) via the network 120 or transmit the received data directly to the processing tool.

The PPA comprises a processor 102 (e.g., an Analog-Digital-Converter and Information (ADCI) Processor), one or more sensors 108, communication device 106 (e.g., a digital communication device (DCD) or optical communication device (OCD)), Electrical Power Source (EPS) 104 and a shielding 110. The processor 102 contains software program instructions for operation of the apparatus. The processor 102 can receive analog data from the sensors 108, convert data into a digital format, and record the data. After recording of data is complete, recorded data can be communicated to the receiver, the processing tool 118 or the computing device through the communication device 106. In some examples, the processor 102 can cause the PPA to transmit converted digital sensor data to the receiver (not shown) in substantially real-time via the wireless or optical channel 122.

In some examples, converted digital sensor data can be stored on a memory (not shown) or storage device of the PPA. The converted digital sensor data is retrieved and processed after the PPA is unloaded from the processing tool 118.

The EPS 104 supplies power to components of the PPA (e.g., the processor 102 and the communication device 106). In some examples, the EPS 104 may supply a current or voltage to the one or more sensors (108) as needed. Alternatively, the EPS 104 may directly serve as excitation source of the sensors (108).

In some examples, the communication device 106 may also receive data from an external device (e.g., the receiver (optional), the processing tool 118 or the computing device). The data from the external device) may include a command for the processor 102 to collect data in a particular format or performing particular functional steps.

The shielding 110 can prevent electromagnetic (EM) radiations within the processing tool from perturbing measurements and signal processing performed by electrically active components (e.g., 108, 104, 102, 106) of the PPA or prevents degradation of electrically active components from potential chemical attack. In some examples, the shielding 110 may include small openings to accommodate transmitting data to and from the communication device 106 or to accommodate measurement of processing properties using the sensors 108. In some examples, the small openings of the shielding 110 are optical openings, which are not actual openings on the shielding 110. The optical openings can allow lights with certain frequencies to pass through but still shield electromagnetic radiations with other frequencies.

Figure 2:
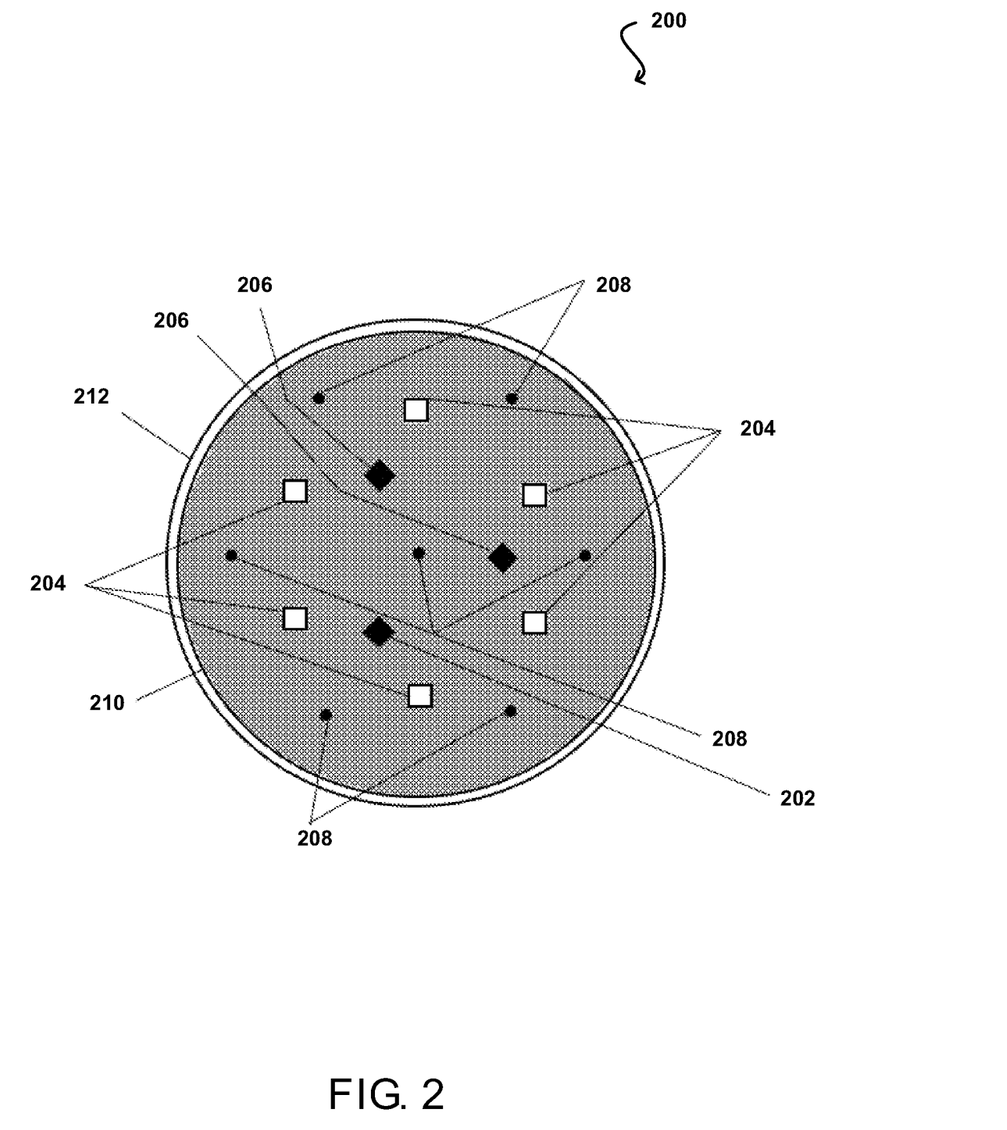
FIG. 2 illustrates an example of a PPA according to some aspects of the present technology.

FIG. 2 illustrates an example of a top view of a PPA 200 according to some aspects of the present technology. In this example, the PPA 200 comprises a circular substrate 212 on which a thin and flexible laminate 210 is attached, a processor 202, a communication device 206, and a plurality of sensors 208. The laminate 210 includes a plurality of Electrical Power Sources (EPS) 204) arranged in a pre-determined pattern (e.g., a pattern with a certain level of symmetry). In some examples, the processor 202, the communication device 206, and/or the plurality of sensors 208 can be arranged in a symmetrical pattern on the substrate 212. In this example, a shield and an electrical isolation material of the PPA 200 is not shown.

Figure 3A:
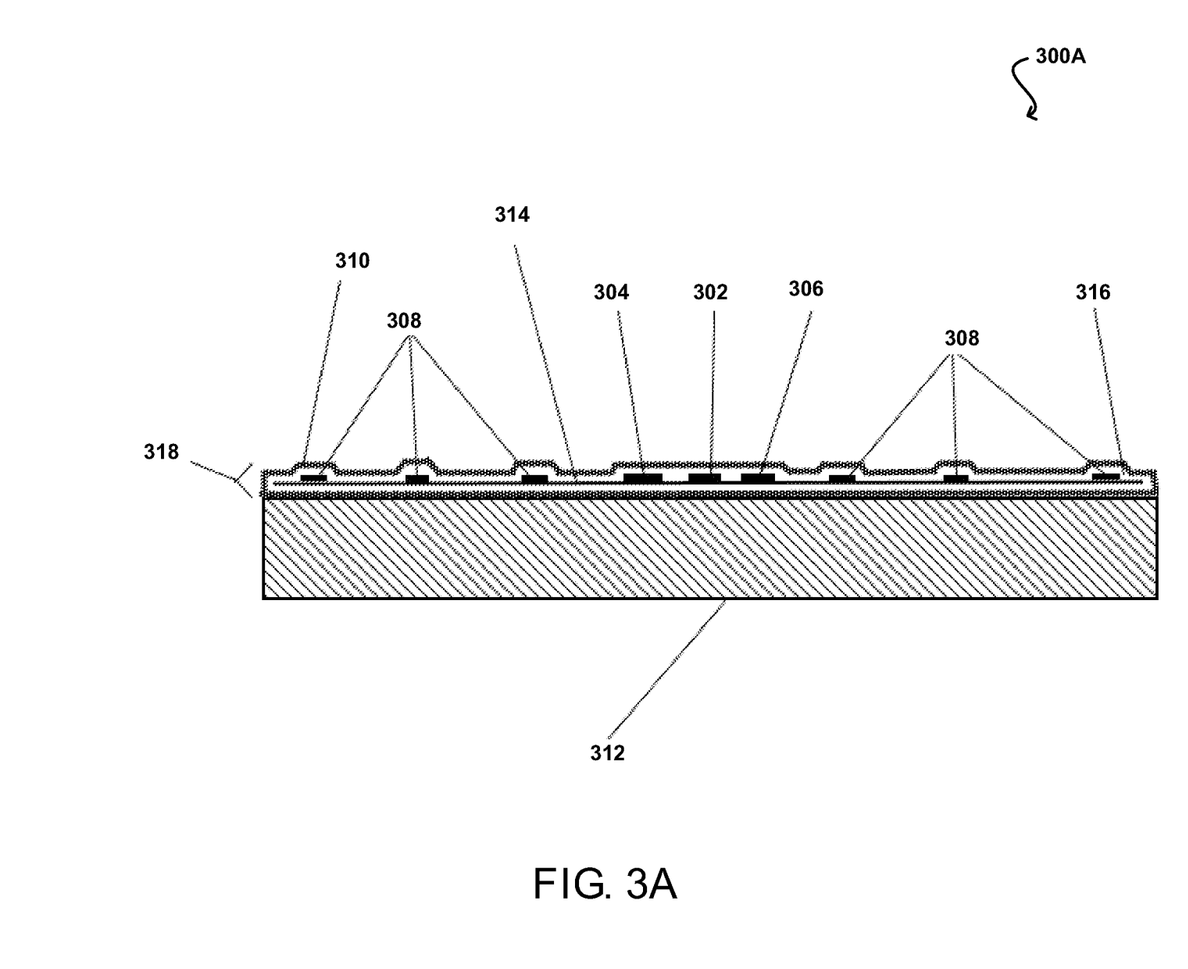
FIGS. 3A-3D illustrate examples of a PPA according to some aspects of the present technology.

FIG. 3A illustrates another example of a PPA 300A according to some aspects of the present technology. In this example, the PPA 300A is shown from a side view. The PPA 300A comprises a thin flexible laminate 318 that is uniformly attached to the top of a substrate 312. Examples of the substrate 312 may include a circular semiconductor wafer with various thicknesses (e.g., 0.5-3 mm) and various diameters (e.g., 450 mm, 300 mm, or 200 mm), or disk of other material with approximate shape and approximate physical dimensions of a semiconductor wafer.

The laminate 318 can comprise one or more electrically active components mounted on a film containing an electrical interconnect 314. The electrically active components include at least one of: one of more EPS 304 (e.g., batteries, capacitors, or solar cells), a processor 302, a communication device 306 (e.g., an infrared communication device, optical communication device, wireless communication device, or wired communication device), one or more sensors 308 (e.g., temperature sensors such as RTDs, thermocouples and optical sensors).

In this example, the laminate 318 includes a shielding 310 that may act as a barrier to chemicals, electromagnetic radiations, and/or contaminants that generally surround components inside a processing tool. In some examples, the shielding 310 may include one or more small openings or optically transparent openings to accommodate data transmissions to and from the communication device 306 and the sensors 308.

In some examples, the laminate 318 includes an electrical isolation material 316 that electrically isolates the shielding 310 from other components of the PPA 300 (e.g., the electrically active component such as the processor 302, the communication device 306, and the sensors 308). The electrical isolation material 316 may include, but is not limited to, materials such as epoxy, insulating films (e.g., polyimide), and silicone.

Figure 3B:
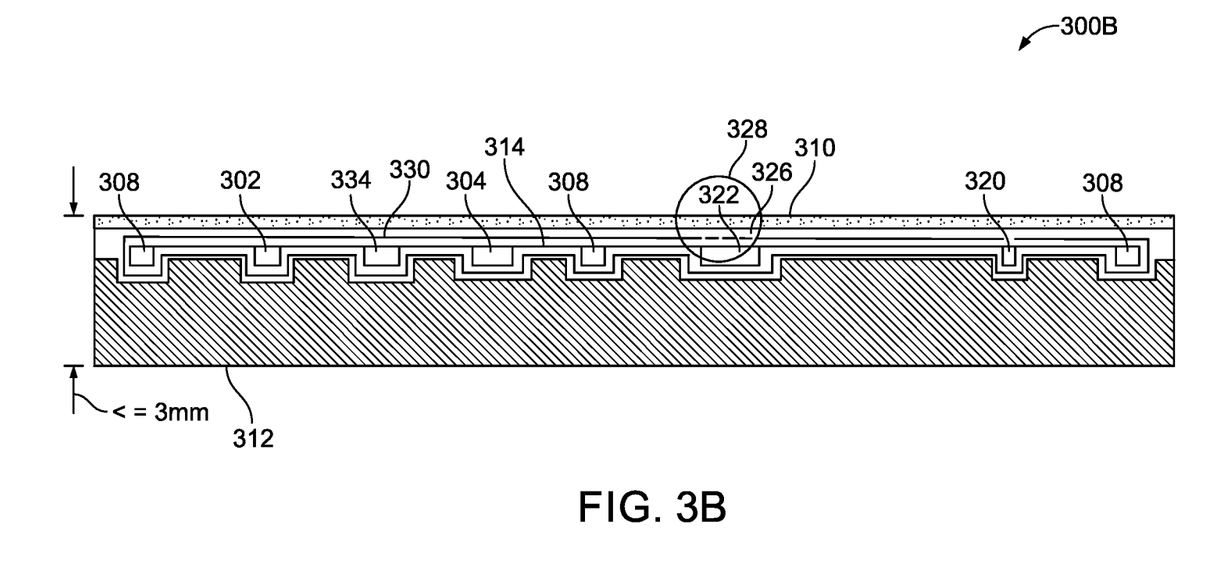

FIG. 3B illustrates another example of a PPA 300B according to some aspects of the present technology. In this example, the PPA 300B is shown from a side view. The PPA 300B comprises an active layer situated on top of a substrate (e.g., a silicon wafer 312). The active layer comprises a barrier layer 310 on top. The barrier layer 310 is substantially flat, and is composed of, but not limited to, Silicon Nitride or Silicon Dioxide that can be applied by known deposition techniques such as Physical Vapor Deposition. The active layer further comprises a CPU 302, a memory 334, a power source 304, a plurality of sensors 308, an optical power recharging system 322, an IR or optical I/O device 320, a fill material 326, an EM shield layer 330, and an electrical interconnect 314 that electrically connect active components of the PPA 300B. Electrical interconnects 314 may be incorporated in a flexible printed circuit board that is laminated onto the substrate along with components. The plurality of sensors 308 can be temperature sensors, such as resistance thermal detectors (RTDs), thermocouples and/or optical sensors. The power source 304 supplies power to other components of the PPA 300B. The optical power recharging system (e.g., a solar cell) can be used to recharge the power source 304 without compromising the integrity of the PPA 300B or without physically contacting the PPA 300B. The fill material 326 is used to fill spaces between active components of the PPA 300B, and can be electrical insulating and have similar thermal properties as the substrate. The EM shield layer 330 can prevent EM radiations within a processing tool from perturbing measurements and signal processing performed by electrically active components (e.g., 308, 304, 302, and/or 306) of the PPA 300B.

In this example, the total thickness of the PPA 300B that includes the substrate 312 and other components of the PPA 300B is less or equal to 3 mm. The EM shield layer 330 comprises an optical opening 328 on top of the optical power recharging system 322 that is optically transparent to allow lights with a first range of frequencies to pass through and reach to the optical power recharging system 322. The EM shield layer 330 may also contain additional optical opening(s) on top of the IR or optical I/O device 320 such that the IR or optical I/O device 320 can communicate with a receiver (not shown) outside the PPA 300B. If sensor 308 are optical sensors, then additional openings in the EM shield layer 330 can be provided to allow passage of visible, IR, or UV light to be measured Portions of the barrier layer 310 and the filler material 326 that are in the proximity of the optical power recharging system 322 and/or the IR or optical I/O device 320 can be operable to allow lights with the first range of frequencies to pass through and/or allow the IR or optical I/O device 320 to communicate with the receiver (not shown).

The processor 302 can receive data from the plurality of sensors via the electrical interconnect 314, and convert received sensor data into digital sensor data. The processor 302 may store converted sensor data into the memory 334. Stored sensor data can be retrieved and processed after the PPA 300B is unloaded from a processing tool. In some examples, the processor 302 may cause the converted sensor data to transmit to a receiver (not shown) via the IR or optical I/O device 320 while the PPA 300B is still inside a processing tool.

Figure 3C:
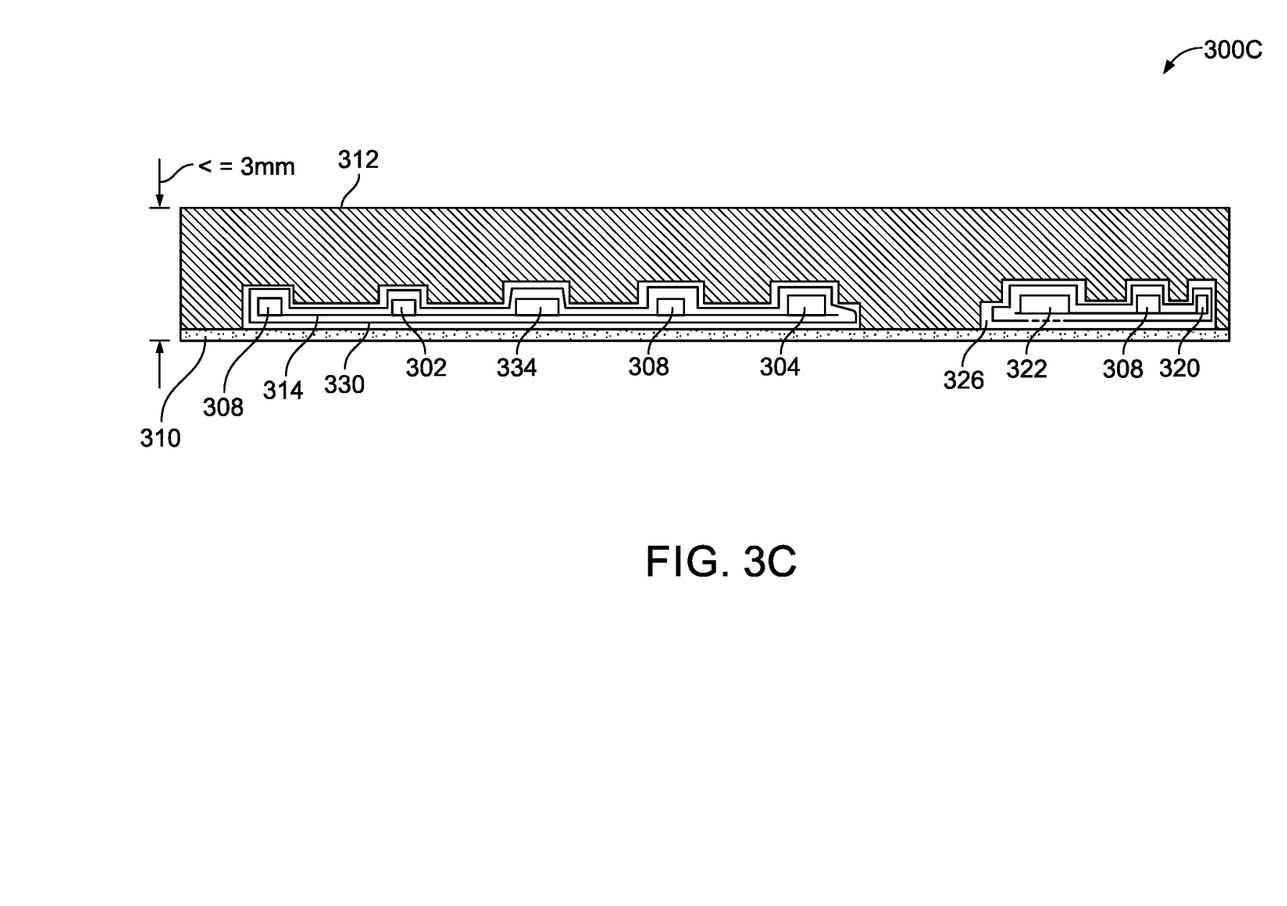

FIG. 3C illustrates another example of a PPA 300C according to some aspects of the present technology. In this example, the PPA 300C is shown from a side and cross-sectional view. The PPA 300C comprises an active layer situated at bottom of a substrate (e.g., a silicon wafer 312). The active layer comprises a contamination barrier layer 310 at the bottom. The contamination barrier layer 310 is substantially flat, and contacts the electrostatic chuck when the PPA 300C is used to gather processing data. The active layer further comprises a CPU 302, a memory 334, a power cell 304, a plurality of sensors 308, an optical power recharging system 322, an IR or optical I/O device 320, an EM shielding layer 310, a fill material 326, and an interconnect 314 that electrically connect active components of the PPA 300C. The power source 304 supplies power to other components of the PPA 300C. The optical power recharging system (e.g., a solar cell) can be used to recharge the power source 304 without compromising the integrity of the PPA 300C. The IR or optical I/O device 320 can communicate with a receiver (not shown) outside the PPA 300C via an IR or optical channel. The fill material 326 is used to fill spaces between active components of the PPA 300C. In this example, the active layers on the right side and left side are representational of active regions that are connected elsewhere in the silicon by channels in the silicon that are not explicitly shown.

Figure 3D:
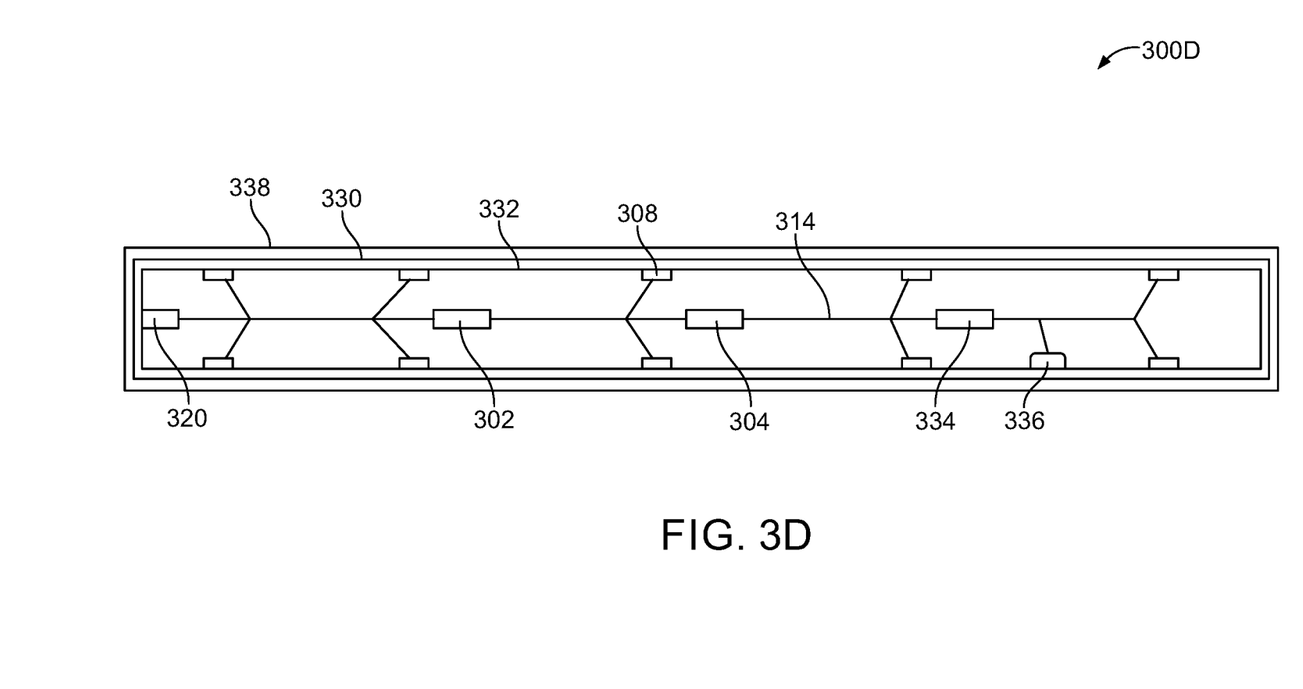

FIG. 3D illustrates another example of a PPA 300D according to some aspects of the present technology. In this example, the PPA 300D comprises a particle and contamination shielding 336, an electromagnetic shielding 330, a thermal conduction medium 332, a plurality of temperature sensors 308, one or more interconnects 314, a memory 334, one or more placement sensors 336, a power source 304, a microprocessor 302, and a wireless communication device 320.

The particle and contamination shielding 336 is an outer layer of the PPA 300D and is operable to protect a processing tool from contamination from the PPA 300D. The electromagnetic shielding 330 can be disposed inside the particle and contamination shielding 336 and connected to the plurality of sensors 308 via the thermal conduction medium 332. The electromagnetic shielding 330 is operable to prevent electromagnetic radiations within the processing tool from interfering measurements and signal processing performed by electrically active components (e.g., 308, 336, 334, 304, 302 and 320) of the PPA 300D.

The plurality of sensors 308 can be disposed on the first surface and the second surface of the thermal conduction medium 332. The plurality of sensors 308 can be arranged in a pre-determined pattern (e.g., a pattern with a certain level of symmetry).

The memory 334 is configured to store data received from the plurality of temperature sensors 308 and programs for the microprocessor 302. The wireless communication device 320 is configured to transmit data collected within the PPA 300D to an outside device (not shown) or receive data and instructions from the outside device.

The power source 304 is configured to supply power to electrically active components (e.g., 308, 336, 334, 304, 302 and 320) of the PPA 300D. The power source 304 may include at least one of batteries, capacitors, or solar cells. In some examples, the PPA 300D further comprises a sensor excitation source, and A/D converter (not shown).

The one or more placement sensors 336 are configured to detect a relative position between the PPA 300D and an electrostatic chuck (ESC) of the processing tool. The one or more placement sensors 336 may detect an onset of electrostatic clamping and provide a time reference to start temperature measurements for the plurality of sensors 308.

Figure 4:
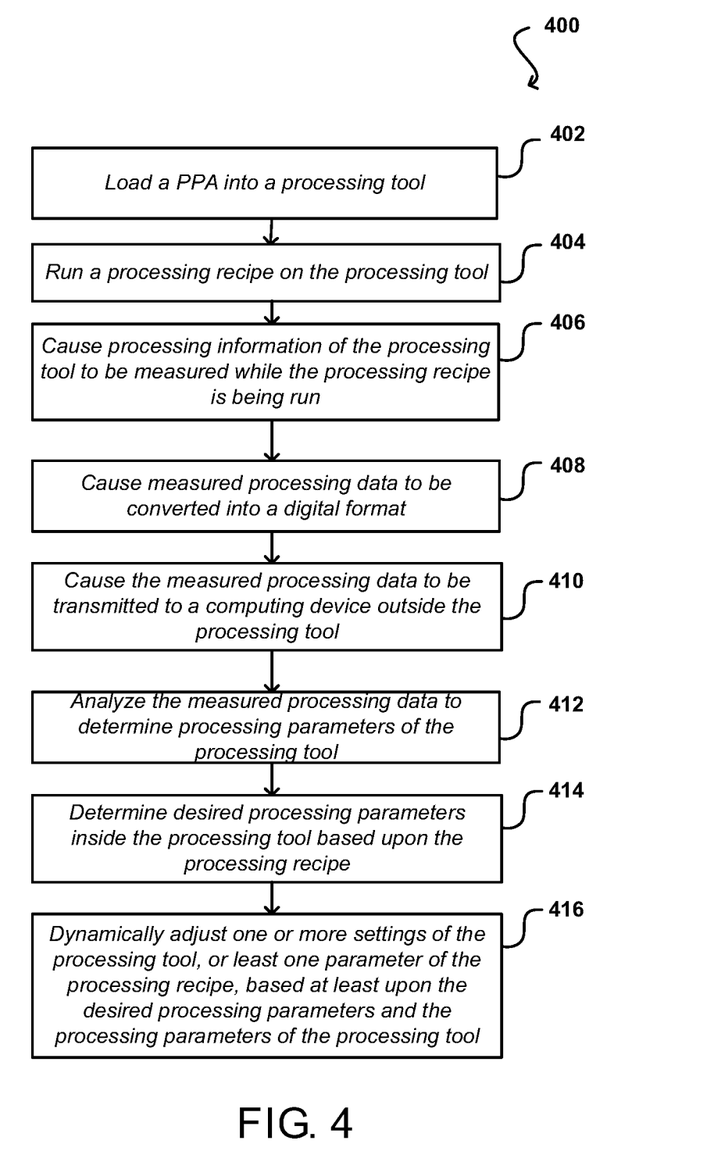
FIG. 4 illustrates an example process of method of measuring processing properties of a processing tool according to some aspects of the present technology.

FIG. 4 illustrates an example process 400 of determining processing properties of a processing tool according to some aspects of the present technology. It should be understood that there can be additional, fewer, or alternative steps performed in similar or alternative orders, or in parallel, within the scope of the various examples unless otherwise stated. The example method 400 starts with loading a PPA into a processing tool, at step 402. In some examples, the PPA can be pre-programmed to enable the PPA to perform various measurements.

At step 404, a processing recipe can be run on the processing tool, as illustrated in FIG. 1. The PPA can measure processing information of the processing tool while the processing recipe is running, at step 406, and convert measured processing data into a digital formation, at step 408.

At step 410, the measured processing data can be transmitted to a computing device or a receiver outside the processing tool, as illustrated in FIGS. 1-3. In some examples, measured processing data can be transmitted while the processing recipe is running on the processing tool. In some example, measured processing data can be stored on the PPA and sent to a computing device after the PPA is unloaded from the processing tool.

At step 412, the measured processing data can be analyzed to extract processing parameters of the processing tool while the processing recipe was running, as illustrated in FIGS. 1-3. In some examples, the measured processing data can be analyzed by a processor of the PPA. For example, a temperature map or a plasma spectrum inside processing tool may be extracted from the measured processing data.

In some examples, the measured processing data can be analyzed by the computing device. Analyzed data can be used to dynamically control the processing recipe running on the processing tool or used to modify or optimize the processing recipe. The example method 400 further comprises determining desired processing parameters inside the processing tool based upon the processing recipe, at step 414, and dynamically adjusting one or more settings of the processing tool, or at least one parameter of the processing recipe based at least upon the desired processing parameters and the processing parameters of the processing tool.

Figure 5:
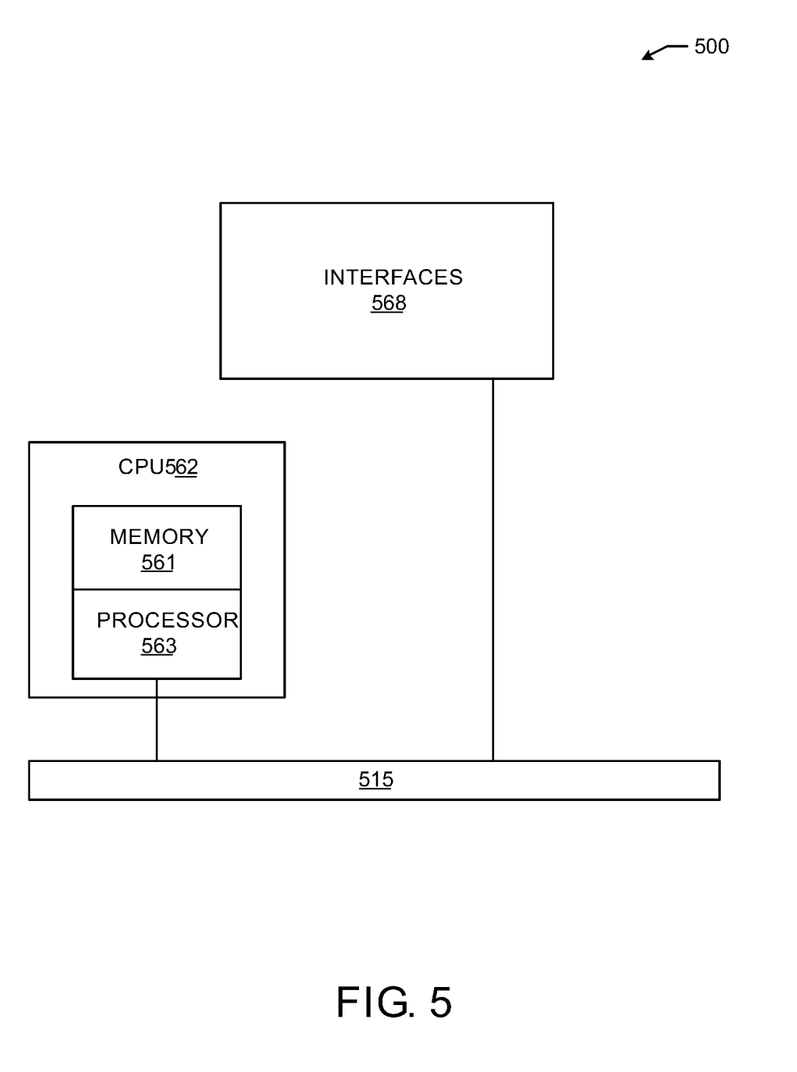
FIG. 5 illustrates an exemplary computing device in accordance with various implementations of the technology.

FIG. 5 illustrates an exemplary computing device 500 in accordance with various implementations of the technology. Computing device 500 includes a master central processing unit (CPU) 562, interfaces 568, and a bus 515 (e.g., a PCI bus). When acting under the control of appropriate software or firmware, the CPU 562 is responsible for executing packet management, error detection, and/or routing functions, such as miscabling detection functions, for example. The CPU 562 preferably accomplishes all these functions under the control of software including an operating system and any appropriate applications software. CPU 562 can include one or more processors 563 such as a processor from the Motorola family of microprocessors or the MIPS family of microprocessors. In an alternative example, processor 563 is specially designed hardware for controlling the operations of the computing device 500. In a specific example, a memory 561 (such as non-volatile RAM and/or ROM) also forms part of CPU 562. However, there are many different ways in which memory could be coupled to the system.

The interfaces 568 are typically provided as interface cards (sometimes referred to as "line cards"). Generally, they control the sending and receiving of data packets over the network and sometimes support other peripherals used with the computing device 500. Among the interfaces that can be provided are Ethernet interfaces, frame relay interfaces, cable interfaces, DSL interfaces, token ring interfaces, and the like. In addition, various very high-speed interfaces can be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they can also include an independent processor and, in some instances, volatile RAM. The independent processors can control such communications intensive tasks as packet switching, media control and management. By providing separate processors for the communications intensive tasks, these interfaces allow the master microprocessor 562 to efficiently perform routing computations, network diagnostics, security functions, etc.

Although the system shown in FIG. 5 is one specific computing device of the present technology, it is by no means the only network device architecture on which the present patent application can be implemented. For example, an architecture having a single processor that handles communications as well as routing computations, etc. is often used. Further, other types of interfaces and media could also be used with the router.

Regardless of the network device's configuration, it can employ one or more memories or memory modules (including memory 561) configured to store program instructions for the general-purpose network operations and mechanisms for roaming, route optimization and routing functions described herein. The program instructions can control the operation of an operating system and/or one or more applications, for example. The memory or memories can also be configured to store tables such as mobility binding, registration, and association tables, etc.

Figure 6:
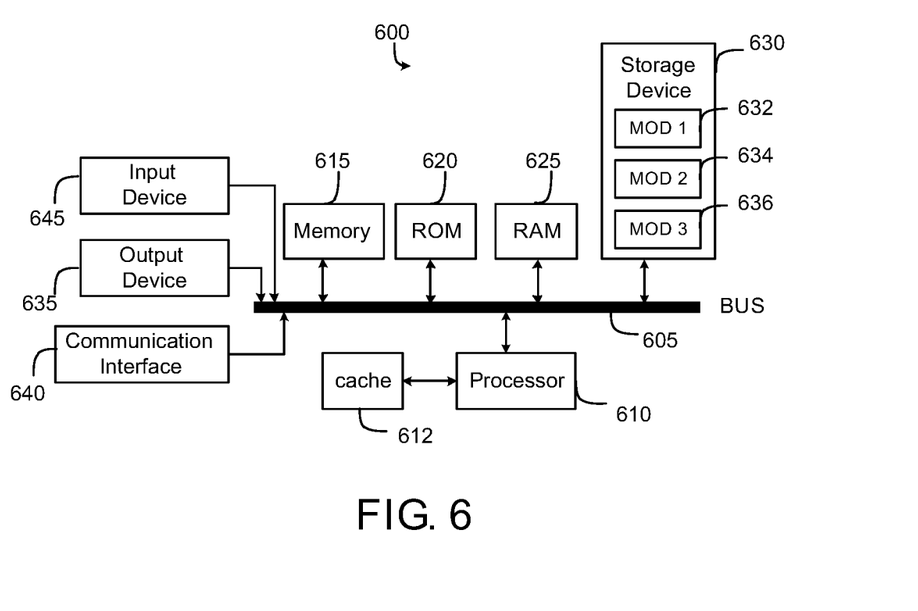
FIGS. 6 and 7 illustrate exemplary systems in accordance with various examples of the present technology.
Figure 7:
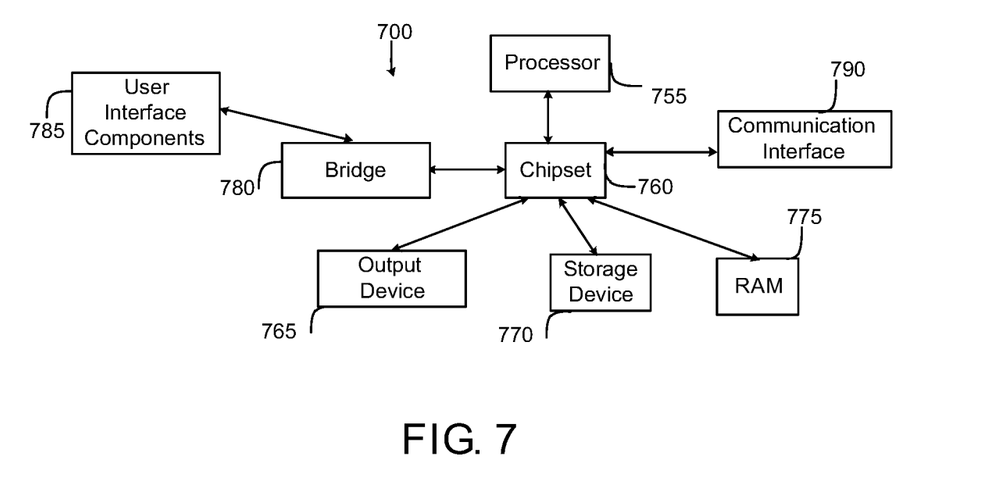

FIG. 6 and FIG. 7 illustrate example possible systems in accordance with various aspects of the present technology. The more appropriate example will be apparent to those of ordinary skill in the art when practicing the present technology. Persons of ordinary skill in the art will also readily appreciate that other system examples are possible.

FIG. 6 illustrates a computing system architecture 600 wherein the components of the system are in electrical communication with each other using a bus 605. Example system 600 includes a processing unit (CPU or processor) 610 and a system bus 605 that couples various system components including the system memory 615, such as read only memory (ROM) 620 and random access memory (RAM) 625, to the processor 610. The system 600 can include a cache of high-speed memory connected directly with, in close proximity to, or integrated as part of the processor 610. The system 600 can copy data from the memory 615 and/or the storage device 630 to the cache 612 for quick access by the processor 610. In this way, the cache can provide a performance boost that avoids processor 610 delays while waiting for data. These and other modules can control or be configured to control the processor 610 to perform various actions. Other system memory 615 can be available for use as well. The memory 615 can include multiple different types of memory with different performance characteristics. The processor 610 can include any general purpose processor and a hardware module or software module, such as module 632, module 634, and module 636 stored in storage device 630, configured to control the processor 610 as well as a special-purpose processor where software instructions are incorporated into the actual processor design. The processor 610 can essentially be a completely self-contained computing system, containing multiple cores or processors, a bus, memory controller, cache, etc. A multi-core processor can be symmetric or asymmetric.

To enable user interaction with the computing device 600, an input device 645 can represent any number of input mechanisms, such as a microphone for speech, a touch-sensitive screen for gesture or graphical input, keyboard, mouse, motion input, speech and so forth. An output device 635 can also be one or more of a number of output mechanisms known to those of skill in the art. In some instances, multimodal systems can enable a user to provide multiple types of input to communicate with the computing device 600. The communications interface 640 can generally govern and manage the user input and system output. There is no restriction on operating on any particular hardware arrangement and therefore the basic features here can easily be substituted for improved hardware or firmware arrangements as they are developed. Any features or steps in any example of this patent application may be mixed with any other features or steps in any other examples.

Storage device 630 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 625, read only memory (ROM) 620, and hybrids thereof.

The storage device 630 can include software modules 632, 634, 636 for controlling the processor 610. Other hardware or software modules are contemplated. The storage device 630 can be connected to the system bus 605. In one aspect, a hardware module that performs a particular function can include the software component stored in a computer-readable medium in connection with the necessary hardware components, such as the processor 610, bus 605, output device 635 (e.g., a display), and so forth, to carry out the function.

FIG. 7 illustrates a computer system 700 having a chipset architecture that can be used in executing the described method and generating and displaying a graphical user interface (GUI). Computer system 700 is an example of computer hardware, software, and firmware that can be used to implement the disclosed technology. System 700 can include a processor 755, representative of any number of physically and/or logically distinct resources capable of executing software, firmware, and hardware configured to perform identified computations. Processor 755 can communicate with a chipset 760 that can control input to and output from processor 755. In this example, chipset 760 outputs information to output device 765, such as a display, and can read and write information to storage device 770, which can include magnetic media, and solid state media, for example. Chipset 760 can also read data from and write data to RAM 775. A bridge 780 for interfacing with a variety of user interface components 785 can be provided for interfacing with chipset 760. Such user interface components 785 can include a keyboard, a microphone, touch detection and processing circuitry, a pointing device, such as a mouse, and so on. In general, inputs to system 700 can come from any of a variety of sources, machine generated and/or human generated.

Chipset 760 can also interface with one or more communication interfaces 790 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 755 analyzing data stored in storage 770 or RAM 775. Further, the machine can receive inputs from a user via user interface components 785 and execute appropriate functions, such as browsing functions by interpreting these inputs using processor 755.

It can be appreciated that example systems 600 and 700 can have more than one processor 610, 755 or be part of a group or cluster of computing devices networked together to provide greater processing capability.

As one of ordinary skill in the art will readily recognize, the examples and technologies provided above are simply for clarity and explanation purposes, and can include many additional concepts and variations.

Various aspects of the present technology provide systems and methods for determining parameters of a process operation inside a processing tool. While specific examples have been cited above showing how the optional operation can be employed in different instructions, other examples can incorporate the optional operation into different instructions. For clarity of explanation, in some instances the present technology can be presented as including individual functional blocks including functional blocks comprising devices, device components, steps or routines in a method embodied in software, or combinations of hardware and software.

The various examples can be further implemented in a wide variety of operating environments, which in some cases can include one or more server computers, user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

To the extent examples, or portions thereof, are implemented in hardware, the present patent application can be implemented with any or a combination of the following technologies: a discrete logic circuit(s) having logic gates for implementing logic functions upon data signals, an application specific integrated circuit (ASIC) having appropriate combinational logic gates, programmable hardware such as a programmable gate array(s) (PGA), a field programmable gate array (FPGA), etc.

Most examples utilize at least one network that would be familiar to those skilled in the art for supporting communications using any of a variety of commercially-available protocols, such as TCP/IP, OSI, FTP, UPnP, NFS, CIFS, AppleTalk etc. The network can be, for example, a local area network, a wide-area network, a virtual private network, the Internet, an intranet, an extranet, a public switched telephone network, an infrared network, a wireless network and any combination thereof.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these technologies can comprise hardware, firmware and/or software, and can take any of a variety of form factors. Typical examples of such form factors include server computers, laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

In examples utilizing a Web server, the Web server can run any of a variety of server or mid-tier applications, including HTTP servers, FTP servers, CGI servers, data servers, Java servers and business application servers. The server(s) can also be capable of executing programs or scripts in response requests from user devices, such as by executing one or more Web applications that can be implemented as one or more scripts or programs written in any programming language, such as Java®, C, C# or C++ or any scripting language, such as Perl, Python or TCL, as well as combinations thereof. The server(s) can also include database servers, including without limitation those commercially available from open market.

Any necessary files for performing the functions attributed to the computers, servers or other network devices can be stored locally and/or remotely, as appropriate. Where a system includes computerized devices, each such device can include hardware elements that can be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system can also include one or more storage devices, such as disk drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared computing device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate examples can have numerous variations from that described above. For example, customized hardware might also be used and/or particular elements might be implemented in hardware, software (including portable software, such as applets) or both. Further, connection to other computing devices such as network input/output devices can be employed.

Storage media and computer readable media for containing code, or portions of code, can include any appropriate media known or used in the art, including storage media and computing media, such as but not limited to volatile and non-volatile, removable and non-removable media implemented in any method or technology for storage and/or transmission of information such as computer readable instructions, data structures, program modules or other data, including RAM, ROM, EPROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the technology and teachings provided herein, a person of ordinary skill in the art will appreciate other ways and/or methods to implement the various aspects of the present technology.

The specification and drawings are, accordingly, to be regarded in an illustrative rather than a restrictive sense. It will, however, be evident that various modifications and changes can be made thereunto without departing from the broader spirit and scope of the patent application as set forth in the claims.

What is claimed is:

1. A computer-implemented method for determining processing parameters of a processing tool, comprising:
loading a processing probe apparatus (PPA) onto an electrostatic chuck (ESC) of the processing tool, the PPA comprising a monitoring substrate and an active layer, the monitoring substrate resembling a semiconductor workpiece, the active layer comprising a processor, a plurality of sensors, a power source, a communication device, an interconnect, an optical charging system, and a shield layer comprising a first optical opening that is optically transparent to allow lights with a first range of frequencies to pass through and reach to the optical charging system and a second optical opening operable to allow the communication device to communicate with a receiver outside the PPA, the shield layer being operable to prevent electromagnetic (EM) radiations within the processing tool from interfering with measurements and signal processing performed by components of the active layer, and the optical charging system being operable to charge the power source without physically contacting the PPA;
running a processing recipe on the processing tool;
causing the PPA to measure processing parameters of the processing tool while the processing recipe is being run;
receiving measured processing data from the PPA; and
analyzing the measured processing data to determine the processing parameters.

2. The computer-implemented method of claim 1, wherein the plurality of sensors are resistance thermal detectors (RTDs), thermocouples, or optical sensors.

3. The computer-implemented method of claim 2, wherein the PPA further comprises one or more placement sensors, the one or more placement sensors configured to detect a relative position between the PPA and the electrostatic chuck (ESC) of the processing tool.

4. The computer-implemented method of claim 3, wherein the one or more placement sensors are configured to sense an onset of electrostatic clamping and provide a time reference to start temperature measurements for the plurality of sensors.

5. The computer-implemented method of claim 1, wherein the PPA further comprises a barrier layer, the barrier layer having a substantially flat top surface and being disposed on top of the active layer, the active layer being disposed on top of the substrate.

6. The computer-implemented method of claim 1, wherein the active layer further comprises a fill material operable to fill spaces between components of the active layer.

7. The computer-implemented method of claim 1, wherein the active layer further comprises a thermal conduction medium, the plurality of sensors being disposed on a first surface and a second surface of the thermal conduction medium, the first surface and the second surface being opposite to each other.

8. The computer-implemented method of claim 1, wherein the PPA further comprises a barrier layer, the barrier layer having a substantially flat bottom surface, the active layer being disposed on top of the barrier layer, the substrate being disposed on top of the active layer.

9. An apparatus for determining processing parameters of a processing tool, comprising:
- a monitoring substrate resembling a semiconductor workpiece; and
- an active layer attached to the monitoring substrate, the active layer comprising:
  - a processor;
  - a plurality of sensors;
  - a power source;
  - a communication device;
  - an interconnect;
  - an optical charging system operable to charge the power source without physically contacting the monitoring substrate or the active layer;
  - a shield layer comprising a first optical opening that is optically transparent to allow lights with a first range of frequencies to pass through and reach to the optical charging system and a second optical opening operable to allow the communication device to communicate with a receiver outside the apparatus, the shield layer being operable to prevent electromagnetic (EM) radiations within the processing tool from interfering with measurements and signal processing performed by components of the active layer while a processing recipe is being run, wherein the monitoring substrate and shield layer are shaped for loading on an electrostatic chuck (ESC) of the processing tool; and
- one or more placement sensors, the one or more placement sensors configured to detect a relative position between the apparatus and the electrostatic chuck (ESC) of the processing tool.

10. The apparatus of claim 9, wherein the active layer further comprises a thermal conduction medium, the plurality of sensors being disposed on a first surface and a second surface of the thermal conduction medium, the first surface and the second surface being opposite to each other.

11. The apparatus of claim 9, further comprising a barrier layer, the barrier layer having a substantially flat bottom surface, the active layer being disposed on top of the barrier layer, the substrate being disposed on top of the active layer.

12. The apparatus of claim 9, wherein the active layer further comprises a fill material operable to fill spaces between components of the active layer.

13. The apparatus of claim 9, wherein the plurality of sensors are resistance thermal detectors (RTDs), thermocouples, or optical sensors; and wherein the one or more placement sensors are configured to sense an onset of electrostatic clamping and provide a time reference to start temperature measurements for the plurality of sensors.

14. The apparatus of claim 9, further comprising a barrier layer, the barrier layer having a substantially flat top surface and being disposed on top of the active layer, the active layer being disposed on top of the substrate.

15. A processing probe apparatus for determining processing parameters of a processing tool, comprising:
- a monitoring substrate resembling a semiconductor workpiece and having a shape allowing placement on a chuck of the processing tool during performance of a processing recipe by the processing tool; and
- an active layer attached to the monitoring substrate, the active layer comprising:
  - a processor;
  - a plurality of sensors allowing measurement of processing parameters from the processing tool while the processing recipe is performed;
  - a power source;
  - a communication device;
  - an interconnect;
  - an optical charging system operable to charge the power source without physically contacting the monitoring substrate or the active layer; and
- a shield layer comprising a first optical opening that is optically transparent to allow lights with a first range of frequencies to pass through and reach to the optical charging system and a second optical opening operable to allow the communication device to communicate with a receiver outside the apparatus, the shield layer being operable to prevent electromagnetic (EM) radiations within the processing tool from interfering with measurements and signal processing performed by components of the active layer while the processing recipe is performed.

* * * * *